United States Patent
Oh et al.

(10) Patent No.: US 12,250,759 B2
(45) Date of Patent: Mar. 11, 2025

(54) COOKING APPARATUS CAPABLE OF DETECTING TEMPERATURE OF OBJECT TO BE HEATED

(71) Applicant: LG Electronics Inc., Seoul (KR)

(72) Inventors: Dooyong Oh, Seoul (KR); Seungbok Ok, Seoul (KR); Kyunghoon Jung, Seoul (KR); Byeongwook Park, Seoul (KR)

(73) Assignee: LG Electronics Inc., Seoul (KR)

( * ) Notice: Subject to any disclaimer, the term of this patent is extended or adjusted under 35 U.S.C. 154(b) by 211 days.

(21) Appl. No.: 17/116,537

(22) Filed: Dec. 9, 2020

(65) Prior Publication Data

US 2021/0176832 A1 Jun. 10, 2021

(30) Foreign Application Priority Data

Dec. 9, 2019 (KR) .................. 10-2019-0162753

(51) Int. Cl.
*H05B 6/12* (2006.01)
*G01K 7/00* (2006.01)
(Continued)

(52) U.S. Cl.
CPC ............ *H05B 6/1209* (2013.01); *G01K 7/00* (2013.01); *G01R 25/005* (2013.01); *H05B 3/74* (2013.01); *H05B 6/04* (2013.01); *H05B 2213/07* (2013.01)

(58) Field of Classification Search
CPC ....... A47J 2202/00; G01K 7/00; G01R 25/00; G01R 25/005; H05B 3/74; H05B 6/1209;
(Continued)

(56) References Cited

U.S. PATENT DOCUMENTS 9,819,299 B2 * 11/2017 Ajima .................... B62D 5/046
2007/0216055 A1 * 9/2007 Pilavdzic .......... B29C 45/14598
264/40.6

(Continued)

FOREIGN PATENT DOCUMENTS

CA        2145494 C    *  5/2001  ............. H05B 6/062
CN      105337496 B    *  6/2019
(Continued)

OTHER PUBLICATIONS

Art Kay and Timothy Claycomb, TI Designs—Precision: Verified Design Comparator with Hysteresis Reference Design, May 2013, Revised Jun. 2014, Texas Instruments (Year: 2014).*

(Continued)

*Primary Examiner* — Dana Ross
*Assistant Examiner* — Kevin Guanhua Wen
(74) *Attorney, Agent, or Firm* — Fish & Richardson P.C.

(57) ABSTRACT

A cooking apparatus includes: a working coil, an inverter including a plurality of switching elements and configured to apply, by operating the plurality of switching elements, a resonant current of a predetermined frequency to the working coil, a phase detector configured to detect a phase difference between the resonant current and a voltage applied to an output terminal of the inverter, and a controller configured to calculate, based on the detected phase difference, a temperature of a target object that is placed above the working coil.

17 Claims, 9 Drawing Sheets

(51) Int. Cl.
*G01R 25/00* (2006.01)
*H05B 3/74* (2006.01)
*H05B 6/04* (2006.01)

(58) Field of Classification Search
CPC . H05B 6/04; H05B 6/062; H05B 6/12; H05B 2213/07
See application file for complete search history.

(56) References Cited

U.S. PATENT DOCUMENTS

| | | | | |
|---|---|---|---|---|
| 2008/0121633 A1* | 5/2008 | Pinilla | ............... | H05B 6/06 219/494 |
| 2013/0078346 A1 | 3/2013 | Schilling et al. | | |

FOREIGN PATENT DOCUMENTS

| | | | | |
|---|---|---|---|---|
| EP | 3300453 | | 3/2018 | |
| WO | WO2004077000 | | 9/2004 | |
| WO | WO-2004077000 A1 * | | 9/2004 | ............... G01K 7/00 |
| WO | WO-2012073379 A1 * | | 6/2012 | ............... H05B 6/06 |
| WO | WO-2014069526 A1 * | | 5/2014 | .......... H02M 5/4585 |

OTHER PUBLICATIONS

Electronics Tutorials, Insulated Gate Bipolar Transistor, Mar. 2014, https://web.archive.org/web/20140313170245/https://www.electronics-tutorials.ws/power/insulated-gate-bipolar-transistor.html (Year: 2014).*
Tim Regan, Greg Zimmer, Michael Stokowski, Current Sense Circuit Collection, Dec. 2005, Linear Technology, Application Note 105 (Year: 2005).*
What is a Pulse Resistor and How to Choose One, Sep. 5, 2022, Riedon, <https://riedon.com/blog/what-is-a-pulse-resistor-and-how-to-choose-one/> (Year: 2022).*
Art Kay and Timothy Claycomb, TI Designs—Precision: Verified Design Comparator with Hysteresis Reference Design, May 2013, Revised Jun. 2014, Texas Instruments (Year: 2013).*
Anthony Fagnani, Application Report, IQ vs Accuracy Tradeoff In Designing Resistor Divider Input To A Voltage Supervisor, Feb. 2011, Revised Apr. 2021, Texas Instruments (Year: 2021).*
Electronics Tutorials, Insulated Gate Bipolar Transistor, Mar. 2014, https:/web.archive.orgAweb/20140313170245/https:/www.electronics-tutorials.ws/power/insulated-gate-bipolar-transistor.html (Year: 2014).*
G. Fettweis et al., Zero Crossing Modulation for Communication with Temporally Oversampled 1-Bit Quantization, Dec. 2, 2019, 53rd Asilomar Conference on Signals, Systems, and Computers, Pacific Grove, CA, USA, doi: 10.1109/IEEECONF4 (Year: 2019).*
Yuan, Jiaxin & Zhao, Zhen & Chen, Bing & Li, Cong & Wang, Jiacheng & Tian, Cuihua & Chen, Yuanfeng. (2015). An Immune-Algorithm-Based Dead-Time Elimination PWM Control Strategy in a Single-Phase Inverter. Power Electronics, IEEE Transactions on. 30. 3964-3975. 10.1109/TPEL.2014.2347974. (Year: 2015).*
Machine translation of WO 2012073379 A1 performed on Mar. 13, 2024, Uchida et al. (Year: 2012).*
Machine translation of WO 2014069526 A1 performed on Mar. 13, 2024, Uchida (Year: 2014).*
EP Extended European Search Report in European Appln. No. 20212673.6, dated Apr. 30, 2021, 6 pages.

* cited by examiner

COOKING APPARATUS CAPABLE OF DETECTING TEMPERATURE OF OBJECT TO BE HEATED

CROSS-REFERENCE TO RELATED APPLICATION

The present disclosure claims priority to and the benefit of Korean Patent Application No. 10-2019-0162753, filed on Dec. 9, 2019, in the Korean Intellectual Property Office, the disclosure of which is incorporated herein by reference in its entirety.

TECHNICAL FIELD

The present disclosure relates to a cooking apparatus, and more particularly to a cooking apparatus capable of detecting temperature of an object to be heated.

BACKGROUND

A cooking apparatus is used as one of various home appliances for cooking in a kitchen area. The cooking apparatus may cook foods according to a user's intention. Such cooking apparatus may be classified into various types according to heat sources, fuel types, and the like.

Among the cooking apparatuses, an electric range market is gradually growing as the electric range does not produce carbon monoxide during combustion, and is associated with a low risk of safety accidents such as gas leakage, fire, and the like.

Examples of the electric range may include a Hi-Light range that uses a nichrome wire having high electrical resistance to convert electricity into heat, and an induction range that uses an electromagnetic field for heating by electromagnetic induction.

The induction type cooking apparatus has a working coil, through which a high-frequency current flows to generate strong magnetic lines of force. For example, when the magnetic lines of force, which are generated by the working coil, pass through a cooking utensil such as a metal cooking pot and the like, an eddy current is formed in the cooking utensil, and heat is generated by the eddy current flowing in the cooking utensil, thereby heating the cooking utensil itself, as well as the contents in the cooking utensil.

In order to cook foods according to a user's intention, a cooking utensil may need to be heated at a proper temperature and constantly maintained at the temperature. For example, measuring the temperature of the cooking utensil or the contents therein with a thermometer may be cumbersome for the user and may cause safety problems as well.

In order to solve the above problems, a conventional cooking apparatus may provide a temperature sensor for detecting a temperature of a cooking utensil by using long-wavelength infrared (LWIR), mid-wavelength infrared (MWIR), and the like.

However, such temperature sensor introduces problems that the temperature sensor is expensive, and the temperature sensor as well as a temperature detection circuit occupy a large volume of space within the conventional cooking apparatus.

Also, another problem is introduced that in order to accurately detect the temperature of the cooking utensil, the temperature sensor may need to be adjacent to the cooking utensil, but in many cases the cooking utensil is heated at high temperature (e.g., 200° C. or higher), such that the temperature sensor disposed near the cooking utensil is highly prone to damage due to high temperature. Thus, in order to prevent the damage, a separate cooling device may be further required.

SUMMARY

The present disclosure is directed to a cooking apparatus.

According to one aspect of the subject matter described in this application, a cooking apparatus includes a working coil, an inverter including a plurality of switching elements and configured to apply, by operating the plurality of switching elements, a resonant current of a predetermined frequency to the working coil, a phase detector configured to detect a phase difference between the resonant current and a voltage applied to an output terminal of the inverter, and a controller configured to calculate, based on the detected phase difference, a temperature of a target object that is placed above the working coil.

Implementations according to this aspect can include one or more of the following features. For example, the controller can be further configured to calculate, based on a first regression equation that uses the detected phase difference as an independent variable and the temperature of the target object as a dependent variable, the temperature of the target object.

In some examples, the controller can be configured to control, based on the temperature of the target object being lower than a target temperature, the operation of the plurality of switching elements to reduce a frequency of the resonant current, and control, based on the temperature of the target object being higher than the target temperature, the operation of the plurality of switching elements to increase a frequency of the resonant current.

In some implementations, the cooking apparatus can further include a current detector configured to detect the resonant current. The controller can be configured to calculate, based on a second regression equation that uses (i) a magnitude of the resonant current detected by the current detector and the detected phase difference as independent variables and (ii) the temperature of the target object as a dependent variable, the temperature of the target object. In some examples, the magnitude of the resonant current can be a peak value of the resonant current.

In some implementations, the phase detector can include a current transformer including an input coil, which is connected between the inverter and the working coil and through which the resonant current flows, and an output coil configured to generate an output current corresponding to the resonant current, a current detector configured to output a first voltage based on the output current, a voltage detector connected to the output terminal of the inverter and configured to output a second voltage based on the voltage applied to the output terminal of the inverter, and a phase signal generator configured to output, based on the first voltage and the second voltage, a phase signal corresponding to the phase difference. The controller can be configured to calculate the temperature of the target object by receiving the phase signal from the phase signal generator.

In some examples, the phase signal can be a pulse signal, and the controller can be configured to identify the phase difference based on a pulse width of the phase signal. In some implementations, the current detector can include a first current sense resistor connected to the output coil, a diode element connected to the first current sense resistor, a second current sense resistor connected to the diode element, a third current sense resistor having a first end connected to the second current sense resistor and a second end connected to a ground terminal, and a first comparator configured to output the first voltage and including (i) a first positive input terminal that is connected to a first node located between the second current sense resistor and the third current sense resistor and (ii) a first negative input terminal to which a first reference voltage is applied.

In some implementations, the first comparator can be configured to determine, based on a voltage applied to the first positive input terminal being greater than or equal to the first reference voltage applied to the first negative input terminal, a value of the first voltage to be a voltage value corresponding to a high state, and determine, based on a voltage applied to the first positive input terminal being less than the first reference voltage applied to the first negative input terminal, a value of the first voltage to be a voltage value corresponding to a low state.

In some examples, the voltage detector can include a first voltage sense resistor connected to the output terminal of the inverter, a second voltage sense resistor having a first end connected to the first voltage sense resistor and a second end connected to the ground terminal, and a second comparator configured to output the second voltage and including (i) a second positive input terminal connected to a second node located between the first voltage sense resistor and the second voltage sense resistor and (ii) a second negative input terminal to which a second reference voltage is applied. In some implementations, the second comparator can be configured to determine, based on a voltage applied to the second positive input terminal being greater than or equal to the second reference voltage applied to the second negative input terminal, a value of the second voltage to be a voltage value corresponding to a high state, and determine, based on a voltage applied to the second positive input terminal is less than the second reference voltage applied to the second negative input terminal, a value of the second voltage to be a voltage value corresponding to a low state.

In some examples, the phase signal generator can include a first pulse generation resistor connected to an output terminal of the current detector, a second pulse generation resistor connected to an output terminal of the voltage detector, a third pulse generation resistor connected between the second pulse generation resistor and the ground terminal, and a third comparator configured to output the phase signal and including (i) a third positive input terminal connected to a third node to which the first to third pulse generation resistors are connected and (ii) a third negative input terminal to which a third reference voltage is applied.

In some implementations, the third comparator can be configured to generate, based on a voltage applied to the third positive input terminal being greater than or equal to the third reference voltage applied to the third negative input terminal, the phase signal in a high state, and generate, based on a voltage applied to the third positive input terminal being less than the third reference voltage applied to the third negative input terminal, the phase signal in a low state. In some examples, the controller can be configured to identify the pulse width of the phase signal based on a period of time during which the phase signal in the high state is received.

In some implementations, the voltage, applied to the output terminal of the inverter, can be a voltage applied to a switching element connected between the working coil and the ground terminal, among the plurality of switching elements.

In some implementations, the cooking apparatus can further include a glass cooktop on which the target object is placed and disposed adjacent to the working coil. The glass cooktop can be made of a tempered glass of ceramic material.

In some examples, the current detector can further include a hysteresis circuit connected between the first node and an output terminal of the first comparator. In some implementations, the hysteresis circuit can include a first hysteresis resistor connected between the first node and the first positive input terminal, and a second hysteresis resistor having a first end connected between the first hysteresis resistor and the first positive input terminal and a second end connected to the output terminal of the first comparator.

In some implementations, the first to third pulse generation resistors can be configured to distribute a voltage applied to the third positive input terminal.

In some examples, the plurality of switching elements can be insulated gate bipolar transistors.

DETAILED DESCRIPTION

Figure 1:
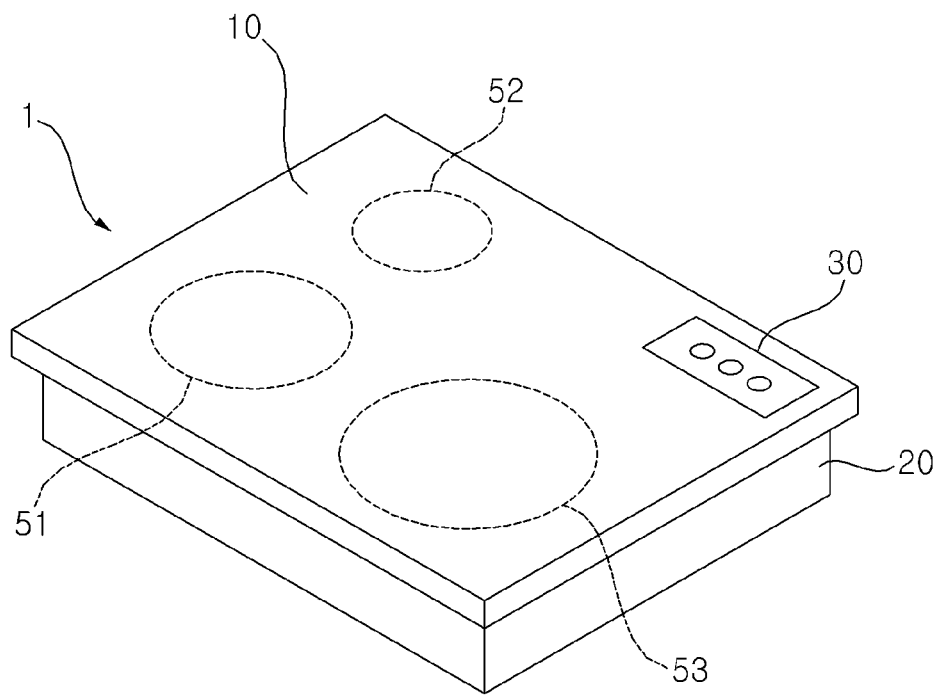
FIG. 1 is a diagram illustrating a perspective view of an exemplary cooking apparatus.
Figure 2:
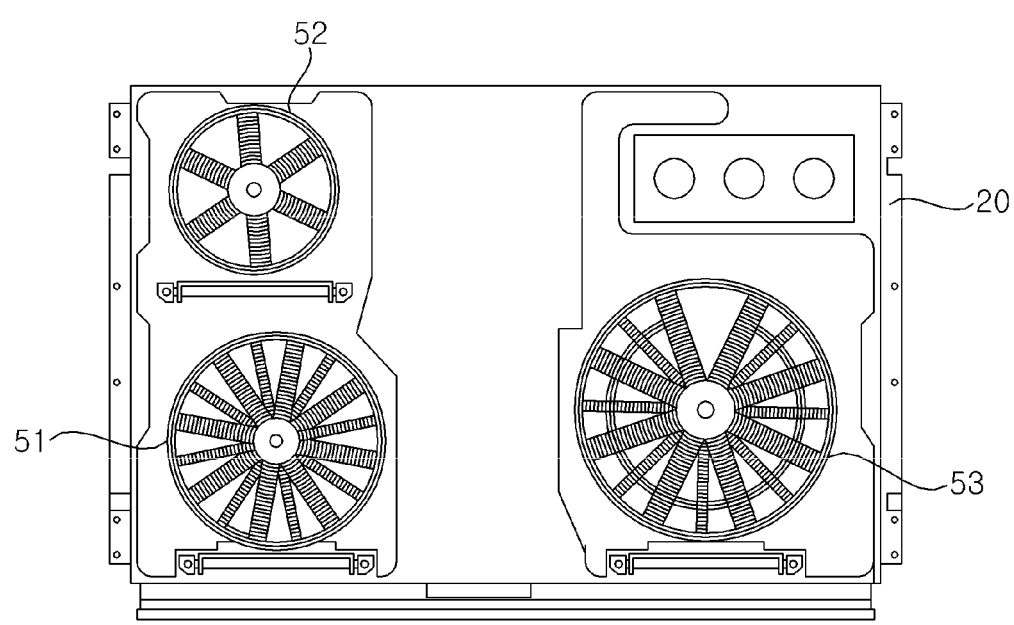
FIG. 2 is a diagram illustrating an interior of the exemplary cooking apparatus of FIG. 1.

FIG. 1 is a diagram illustrating a perspective view of a cooking apparatus 1, and FIG. 2 is a diagram illustrating an interior of the cooking apparatus 1.

Referring to FIGS. 1 and 2, the cooking apparatus 1 can include a glass cooktop 10 on which a cooking utensil is placed, a housing 20, and working coils 51, 52, and 53. In some implementations, the cooking apparatus 1 can have three working coils 51, 52, and 53, but the present disclosure is not limited thereto.

The cooking apparatus 1 can heat a cooking utensil, such as a metal cooking pot, which is placed on the glass cooktop 10. The cooking apparatus 1 can generate a magnetic field, a portion of which can pass through the cooking utensil. In some implementations, the magnetic field passing through the cooking utensil can provide an eddy current that flows in the cooking utensil and generate heat, thereby heating the cooking utensil and contents placed in the cooking utensil.

The glass cooktop 10 can be provided to protect the inside of the cooking apparatus 1 and to support the cooking utensil. For example, the glass cooktop 10 can be made of tempered glass of ceramic material that is synthesized with various minerals.

The working coils 51, 52, and 53 can generate magnetic fields for heating the cooking utensil.

The working coils 51, 52, and 53 can be disposed inside the cooking apparatus 1 and enclosed by the glass cooktop 10 and the housing 20. For example, the working coils 51, 52, and 53 can be disposed adjacent to a lower portion of the glass cooktop 10.

The working coils 51, 52, and 53 can be different from each other. For example, the diameter and a number of turns of the working coils 51, 52, and 53 can be different from each other.

In the entire area corresponding to the glass cooktop 10, each area of the working coils 51, 52, and 53 can be defined as a burner for heating a cooking utensil.

The magnetic field, generated by the working coils 51, 52, and 53, can vary according to the magnitude, direction, and frequency of the current flowing through the working coils 51, 52, and 53, and the output of the burner can vary according to a change in the magnetic field.

The cooking apparatus 1 can include an inverter for applying a current of a predetermined frequency to the working coils 51, 52, and 53. The working coils 51, 52, and 53 can be connected to one inverter, or can be connected respectively to a plurality of inverters.

A user input unit 30 can be disposed on one side of the glass cooktop 10. For example, a user can turn on/off the cooking apparatus 1 or can adjust the output of the burner through the user input unit 30.

In addition, the cooking apparatus 1 can further include a ferrite. The ferrite can be made of a material having high permeability. The ferrite can be provided inside the cooking apparatus 1.

In some implementations, to reduce a leakage magnetic field and to maximize directionality of the magnetic field, the ferrite can induce magnetic fields, generated by the working coils 51, 52, and 53, to flow through the ferrite without being radiated.

Further, the ferrite can serve as a shield to prevent the influence of the magnetic fields, generated by the working coils 51, 52, and 53, or an external magnetic field, on the internal circuit of the cooking apparatus 1.

Figure 3:
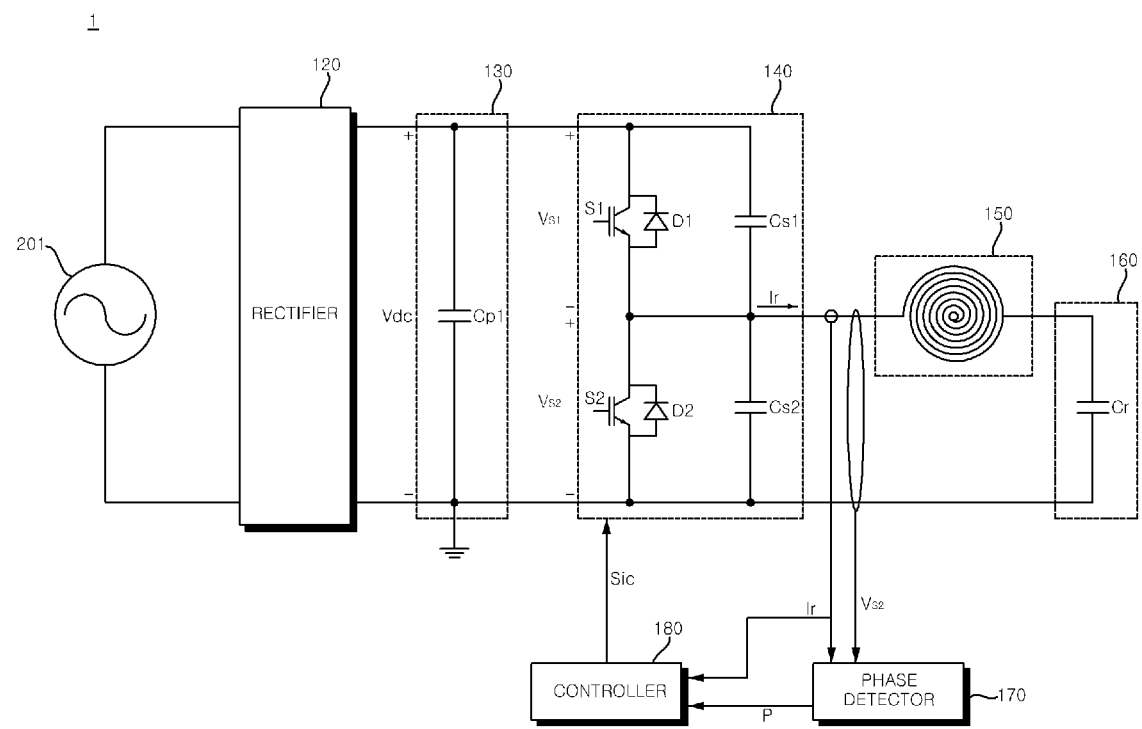
FIG. 3 is an internal block diagram illustrating the exemplary cooking apparatus of FIG. 1.
Figure 4:
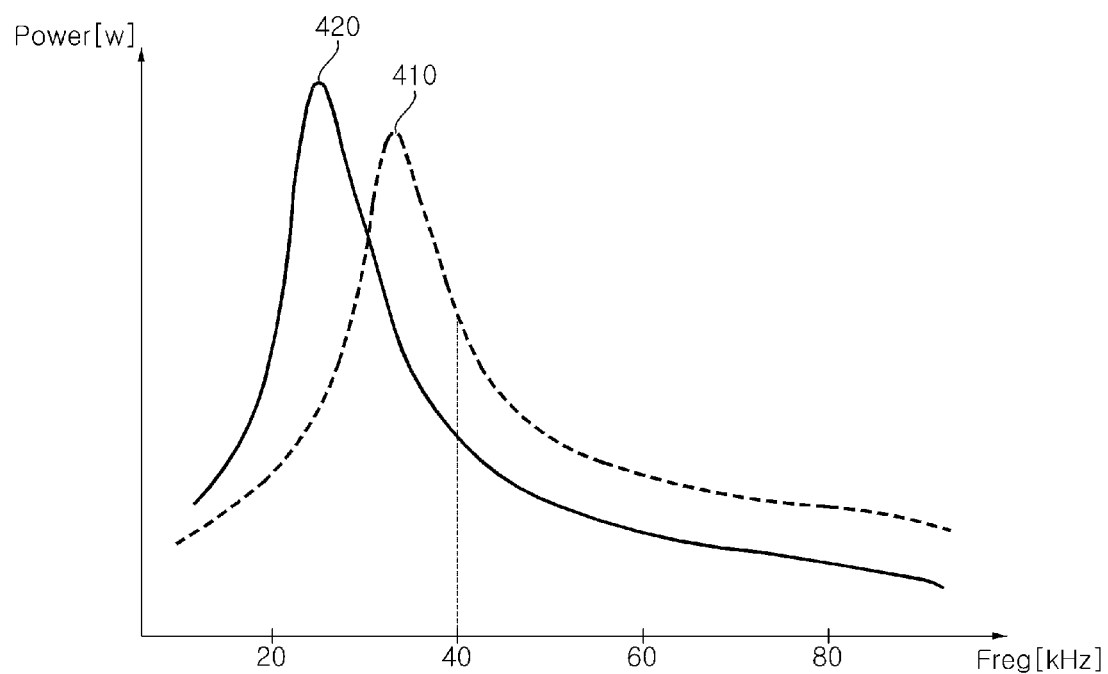
FIGS. 4, 5A, and 5B are diagrams referred to in explaining an operation of a cooking apparatus.
Figure 5A:
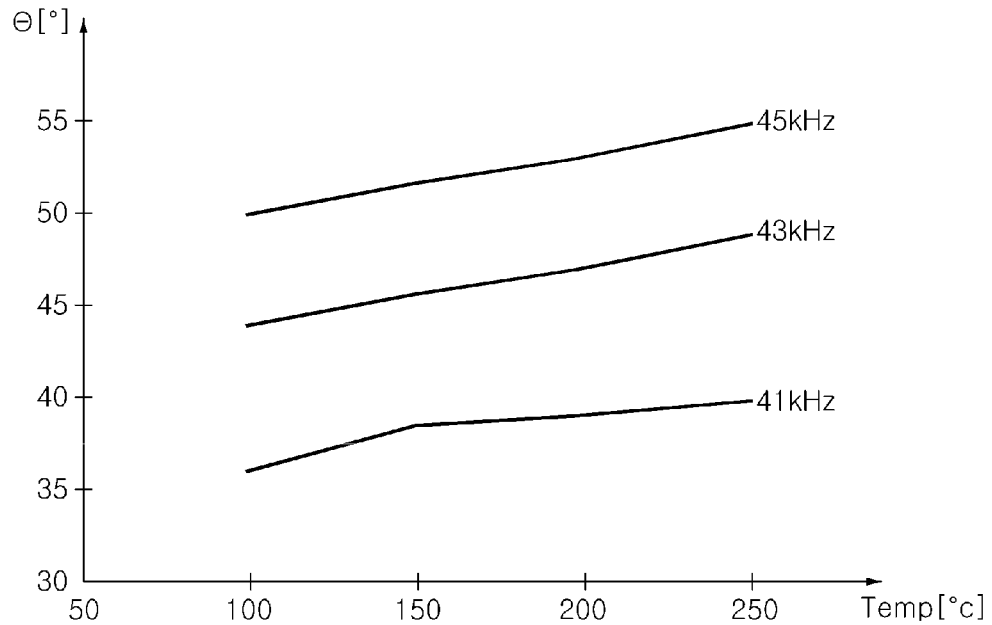
Figure 5B:
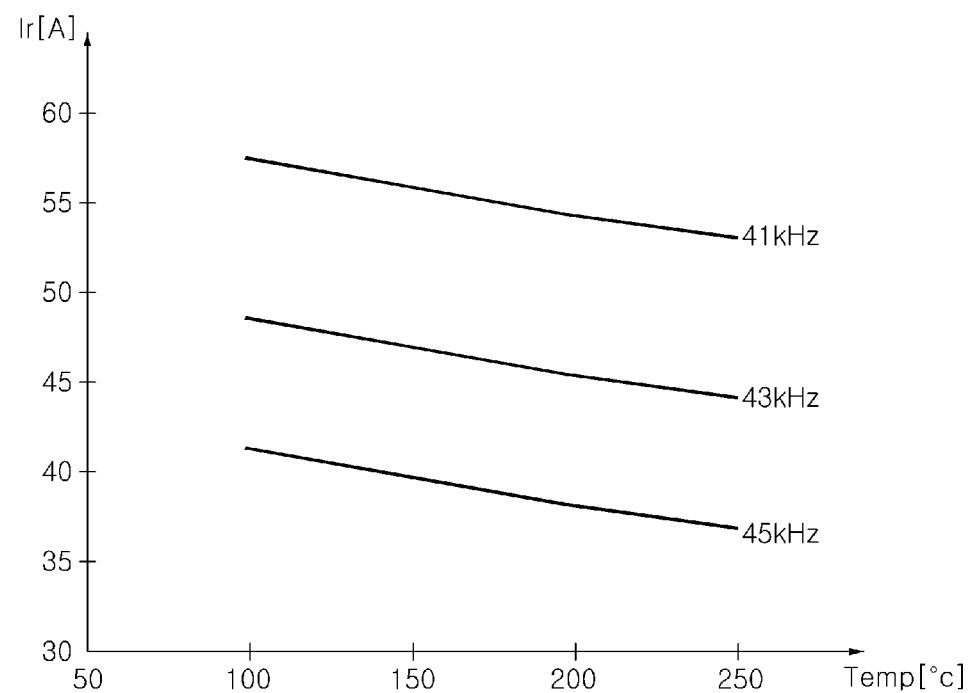

FIG. 3 is an internal block diagram illustrating the cooking apparatus 1. FIGS. 4, 5A, and 5B are diagrams referred to in explaining an operation of a cooking apparatus.

Referring to FIG. 3, the cooking apparatus 1 can include a rectifier 120, a dc-terminal capacitor 130, an inverter 140, a working coil 150 (e.g., working coils 51, 52, and 53 of FIG. 1), a resonator 160, a phase detector 170, and/or a controller 180.

The rectifier 120 can rectify power supplied from an external power source and can output the rectified power. The external power source can be a commercial power source 201 supplying an alternating current (AC) voltage.

The rectifier 120 can convert the AC voltage, supplied from the commercial power source 201, into a direct current (DC) voltage. In some implementations, the commercial power source 201 can be a single-phase or three-phase AC power source.

For example, the rectifier 120 may include a bridge diode including upper arm diode elements and lower arm diode elements. Each pair of an upper arm diode element and a lower arm diode element can be connected in series, and a total of two or three pairs of upper and lower arm diode elements can be connected in parallel. In some implementations, the rectifier 120 can further include a plurality of switching elements.

The dc-terminal capacitor 130 can be connected to a dc-terminal, which is an output terminal of the rectifier 120, and can smooth the DC voltage, supplied from the rectifier 120, and store the smoothed DC voltage. For example, the voltage applied to both ends of the dc-terminal capacitor 130 can refer to a dc-terminal voltage (Vdc).

In some implementations, a plurality of element Cp1 can be provided as the dc-terminal capacitor 130 to ensure device stability.

The inverter 140, including a plurality of switching elements S1 and S2, can convert the DC voltage, smoothed and stored in the dc-terminal capacitor 130, into an AC voltage of a predetermined frequency by the on/off operation of the switching elements S1 and S2, and can output the AC voltage.

For example, in the case where the switching elements S1 and S2 are insulated gate bipolar transistors (IGBT), a switching signal Sic, generated according to a pulse width modulation (PWM) signal, can be output from the controller 180 to be input to a gate terminal of the switching elements S1 and S2. In this case, by the on/off operation of the switching elements S1 and S2 according to the switching signal Sic, a high-frequency current can be output from the inverter 140 to flow through the working coil 150.

For example, when the high-frequency current output from the inverter 140 flows through the working coil 150 while a cooking utensil, such as a metal cooking pot, is placed near the working coil 150, magnetic lines of force, generated by the high-frequency current flowing through the working coil 150, can pass through the cooking utensil. By way of further example, the magnetic lines of force passing through the cooking utensil can provide an eddy current in the cooking utensil that generates heat in the cooking utensil, thereby heating the cooking utensil.

The inverter 140 can further include a plurality of snubber capacitors Cs1 and Cs2. The plurality of snubber capacitors Cs1 and Cs2 can be connected respectively to the plurality of switching elements S1 and S2.

The snubber capacitors Cs1 and Cs2 are provided to control and reduce inrush current or transient voltage generated in the switching elements S1 and S2 and can remove electromagnetic wave noise.

In some implementations, by adjusting a saturation voltage increase rate while the switching elements S1 and S2 are turned off, the snubber capacitors Cs1 and Cs2 can affect the energy loss during the turn-off.

The working coil 150 can have a round shape or a circular sector shape, or a polygonal shape such as a triangular shape or a rectangular shape, but its shape is not limited thereto.

The resonator 160 can include a resonant capacitor Cr connected between the dc-terminal, which is the output terminal of the rectifier 120, and the working coil 150.

For example, one end of the resonant capacitor Cr can be connected to the working coil 150, and the other end of the resonant capacitor Cr can be connected to the dc-terminal capacitor 130.

In some implementations, a resonant frequency of the cooking apparatus 1 can be determined by the capacitance of the resonator 160. For example, the resonant frequency of the cooking apparatus 1 can be determined by the inductance of the working coil 150 and the capacitance of the resonator 160.

Further, a resonance curve can be formed based on the resonant frequency determined by the inductance of the working coil 150 and the capacitance of the resonator 160. For example, the resonance curve can be a curve representing output power over a frequency.

A quality factor (Q) can be determined based on the inductance of the working coil 150 and the capacitance of the resonator 160, and the resonance curve can vary according to the quality factor (Q).

Accordingly, the cooking apparatus 1 can have different output characteristics according to the inductance of the working coil 150 and the capacitance of the resonator 160, and a frequency, at which maximum power is output, can be referred to as the resonant frequency.

In some implementations, the resonator 160 can include a plurality of resonant capacitors having the same capacitance.

For example, a first end of any one of the plurality of resonant capacitors can be connected to a first end of the dc-terminal capacitor 130, which can be connected to the working coil 150, and one end of the other one of the resonant capacitors can be connected to a second end of the dc-terminal capacitor 130, which can be connected to the working coil 150.

The cooking apparatus 1 can use a frequency band, which is greater than the resonant frequency of the resonance curve, and can increase heating power by decreasing the frequency or can reduce heating power by increasing the frequency.

For example, the cooking apparatus 1 can determine any one of frequencies in a frequency band of 20 kHz to 75 kHz as a switching frequency of the switching elements S1 and S2 included in the inverter 140, and can control the switching elements S1 and S2 to be turned off alternately according to the determined frequency.

The phase detector 170 can detect a phase difference θ between a voltage applied to the output terminal of the inverter 140 and a current applied to the working coil 150, and can output a signal P representing the phase difference θ (hereinafter referred to as a phase signal).

For example, the phase detector 170 can output a pulse signal, corresponding to the phase difference θ between the voltage applied to the output terminal of the inverter 140 and the current applied to the working coil 150, as the phase signal P.

By way of further example, the voltage applied to the output terminal of the inverter 140 can be a switching voltage applied to any one of the plurality of switching elements S1 and S2. While FIG. 3 illustrates an example in which the switching voltage Vs2, applied to the second switching element S2, is applied to the output terminal of the inverter 140, the present disclosure is not limited thereto.

The current applied to working coil 150 can be a high-frequency alternating current (hereinafter referred to as a resonant current Ir), which is output from the inverter 140 as the plurality of switching elements S1 and S2 of the inverter 140 are turned off alternately according to the switching frequency.

The phase detector 170 can include a current detector for detecting the resonant current Ir applied to the working coil 150, a voltage detector for detecting the voltage Vs2 applied to the output terminal of the inverter 140, and a phase signal output unit, which will be described later with reference to FIG. 6.

The controller 180 can be connected to components of the cooking apparatus 1, to control the overall operations of the cooking apparatus 1.

Based on the phase signal P output from the phase detector 170, the controller 180 can calculate a phase difference θ between the voltage Vs2 applied to the output terminal of the inverter 140 and the resonant current Ir applied to the working coil 150.

For example, the controller 180 can receive the phase signal P, which is a pulse signal, from the phase detector 170, and based on a pulse width of the phase signal P, the controller 180 can calculate the phase difference θ between the voltage Vs2 applied to the output terminal of the inverter 140 and the resonant current Ir applied to the working coil 150.

The controller 180 can calculate a temperature of a target object, which is heated by a magnetic field generated by the high-frequency current flowing through the working coil 150.

Referring to FIG. 4, the resonance curve is changed with a change in a temperature of the target object.

More specifically, based on a comparison of a resonance curve 410 when the temperature of the target object is a first temperature (e.g., 100° C.) with a resonance curve 420 when the temperature of the target object is a second temperature (e.g., 250° C.), it can be seen that as the temperature of the target object increases, a resonant frequency decreases which corresponds to an inflection point of the resonance curve.

When temperature at the bottom of a cooking utensil increases, electrical conductivity of the cooking utensil decreases, thereby reducing the eddy current formed in the cooking utensil. A magnetic field is generated by the eddy current, formed in the cooking utensil, in a direction to suppress the magnetic field generated in the working coil 150. A sum of the magnetic field, generated in the working coil 150, and the magnetic field generated by the eddy current can correspond to the inductance L of a resonant circuit.

In some implementations, when the eddy current formed in the cooking utensil is reduced as the temperature at the bottom of the cooking utensil increases, the magnetic field generated by the eddy current also decreases. As a result, the inductance L of the resonant circuit increases, such that the resonant frequency fo decreases as represented by the following Equation 1.

$$fo = \frac{1}{2\pi\sqrt{LC}} \quad \text{[Equation 1]}$$

Further, as depicted by the two resonance curves 410 and 420 in FIG. 4, when the cooking apparatus 1 maintains an operation at a fixed frequency (e.g., 40 kHz), energy transmitted to the cooking utensil, i.e., output of the cooking apparatus 1, is changed with respect to a change in the temperature of the target object.

For example, the output of the cooking apparatus 1 is proportional to a magnitude of the resonant current Ir flowing through the resonant circuit, and to a cosine (cos (0)) of a phase difference θ between the resonant current Ir and the voltage Vs2 applied to the resonant circuit. Accordingly, when the output of the cooking apparatus 1 is changed with respect to a change in the temperature of the target object, the magnitude of the resonant current Ir, and the phase difference θ between the resonant current Ir and the voltage Vs2 applied to the resonant circuit can also be changed.

Referring to FIG. 5A, as the temperature of the target object increases, the phase difference θ between the resonant current Ir and the voltage Vs2 applied to the resonant circuit can be changed linearly.

For example, there is a positive linear relationship between the temperature of the object to be heated and the phase difference θ between the resonant current Ir and the voltage Vs2 applied to the resonant circuit.

Further, referring to FIG. 5B, as the temperature of the target object increases, the magnitude of the resonant current Ir is reduced linearly. For example, the magnitude of the resonant current Ir may be a peak value of the resonant current Ir.

As such, there is a negative linear relationship between the temperature of the target object and the magnitude of the current Ir flowing in the resonant circuit.

Accordingly, the controller 180 can calculate the temperature of the target object based on at least one of the magnitude of the resonant current Ir or the phase difference θ between the resonant current Ir and the voltage Vs2 applied to the output terminal of the inverter 140.

In some implementations, if a resolution for detecting a change in the magnitude of the resonant current Ir is better than a resolution for detecting a change in the phase difference θ between the resonant current Ir and the voltage Vs2 applied to the output terminal of the inverter 140, the controller 180 can first consider the phase difference θ between the resonant current Ir and the voltage Vs2 applied to the resonant circuit, so as to calculate the temperature of the target object.

For example, the controller 180 can calculate the temperature of the target object based on a regression equation, using the phase difference θ between the resonant current Ir and the voltage Vs2 applied to the resonant circuit as an independent variable, and the temperature of the object to be heated as a dependent variable.

By way of further example, the controller 180 can calculate the temperature of the target object based on a regression equation, using the magnitude of the resonant current Ir and the phase difference θ between the resonant current Ir and the voltage Vs2 applied to the resonant circuit as independent variables, and the temperature of the target object as a dependent variable.

Based on the calculated temperature of the object to be heated, the controller 180 can output the switching signal Sic to the inverter 140.

For example, if the calculated temperature of the target object is lower than a target temperature, the controller 180 can output the switching signal Sic to the switching elements 51 and S2, so that the frequency of the resonant current Ir can be reduced.

For example, if the calculated temperature of the target object is higher than the target temperature, the controller 180 can output the switching signal Sic to the switching elements 51 and S2, so that the frequency of the resonant current Ir can be increased.

In some implementations, the controller 180 can change the frequency of the resonant current Ir based on a difference between the calculated temperature of the target object and the target temperature, and a current frequency of the resonant current Ir. In some implementations, the target temperature can be set according to a user input.

Figure 6:
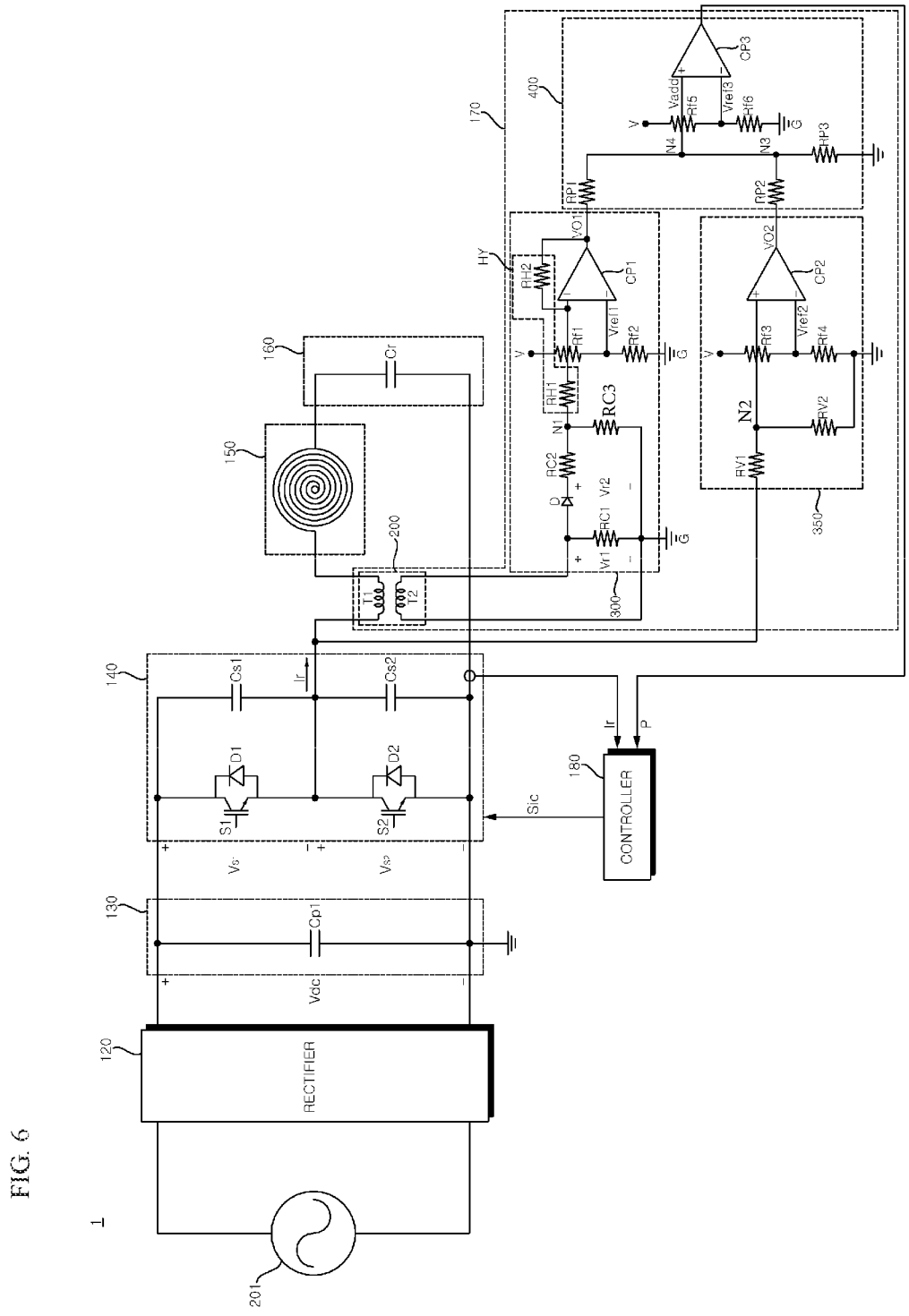
FIG. 6 is a diagram of an internal circuit of the exemplary cooking apparatus of FIG. 3.

FIG. 6 is an internal circuit diagram of the cooking apparatus 1. FIGS. 7 to 12 are diagrams referred to in explaining an operation of a cooking apparatus.

Referring to FIG. 6, the phase detector 170 can include a current transformer 200, a current detector 300, a voltage detector 350, and/or a phase signal output unit 400.

The current transformer 200 can generate a current, having a magnitude less than the resonant current Ir flowing through the working coil 150, to correspond to the resonant current Ir flowing through the working coil 150, and can output the generated current to the current detector 300.

The temperature of the target object can be calculated by using magnitude information of the resonant current Ir flowing in the resonant circuit. However, for other components, such as the controller 180, to use the magnitude information of the resonant current Ir, it is required to reduce the magnitude of the resonant current Ir to a value less than or equal to a predetermined magnitude. Accordingly, the current transformer 200 generates a current having a magnitude less than the resonant current Ir flowing through the working coil 150, and outputs the generated current to the current detector 300.

For example, the current transformer 200 can include an input coil T1, which is connected in series to the working coil 150 and through which the resonant current Ir flows, and an output coil T2 generating a current corresponding to the resonant current Ir flowing through the input coil T1.

In some implementations, the current transformer 200 can be provided such that the input coil T1 has a greater number of turns than the output coil T2.

The current detector 300 can output a first voltage VO1 based on the current transmitted from the current transformer 200, and the first voltage VO1 can be input to the phase signal output unit 400.

The current detector 300 can include first to third current sense resistors RC1 to RC3, a diode D, a first comparator CP1, and/or a hysteresis circuit HY.

The first current-sense resistor RC1 can be connected to the output coil T2 of the current transformer 200, and a voltage Vr1 can be applied to both ends of the first current-sense resistor RC1 according to a current transmitted from the output coil T2.

Figure 7:
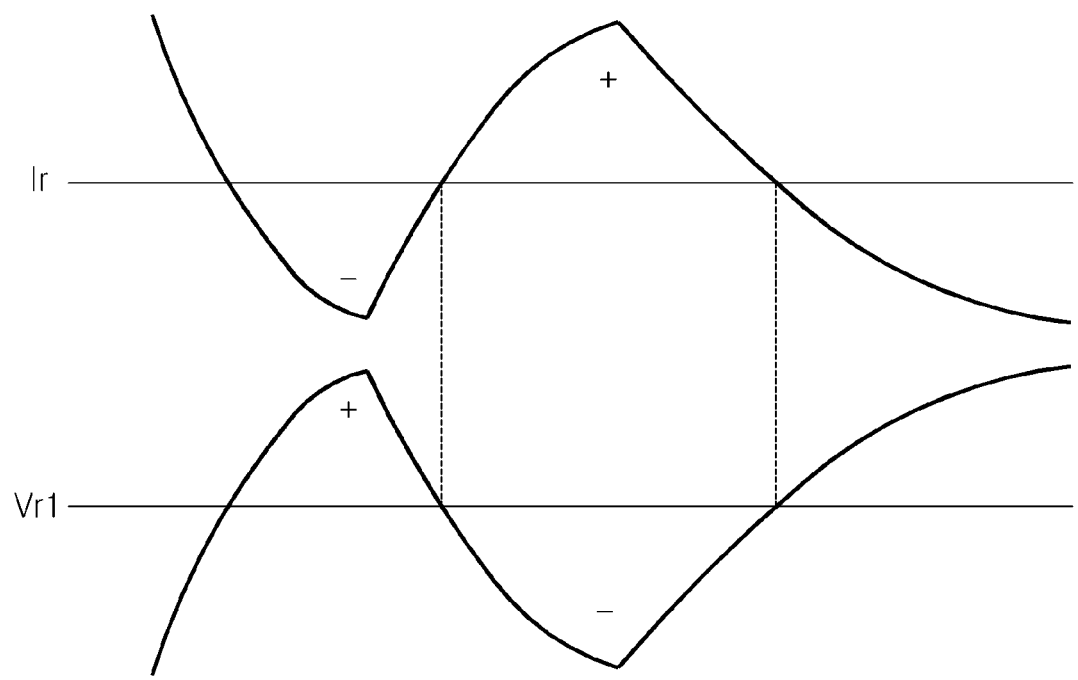
FIGS. 7 to 12 are diagrams referred to in explaining an operation of a cooking apparatus.

For example, as illustrated in FIG. 7, a direction, in which the resonant current Ir flows through the input coil T1 of the current transformer 200, can be opposite to a direction of the voltage Vr1 applied to the first current sense resistor RC1 according to the current transmitted from the output coil T2 of the current transformer 200.

The reason for the opposite directions can be that the direction of the voltage Vr1 is determined based on a position of the ground terminal, serving as a reference for measuring the voltage Vr1 applied to the first current-sensor resistor RC1.

Further, the diode D can be connected to the first current sense resistor RC1. One end of the diode D can be connected to the first current sense resistor RC1, and the other end of the diode D can be connected to the second current sense resistor RC2.

In some implementations, the diode D can remove a negative voltage from the voltage Vr1 converted by the first current sense resistor RC1. For example, the diode D can be turned on, if a voltage at one end of the diode D is greater than a voltage at the other thereof, such that a current can flow from the one end to the other end. Further, the diode D can be turned off, if a voltage at one end of the diode D is less than a voltage at the other end thereof, such that a current cannot flow through the diode D.

Figure 8:
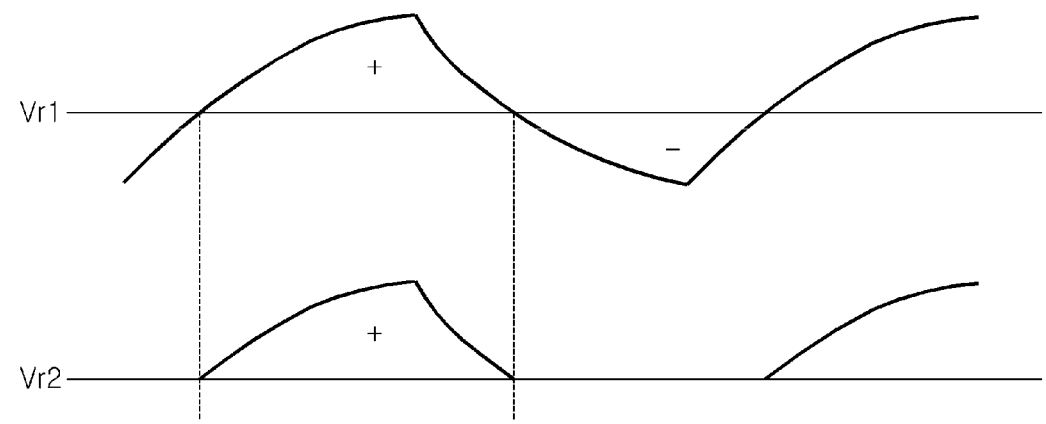

Accordingly, as illustrated in FIG. 8, if the voltage Vr1, applied to the first current sense resistor RC1, is positive (+), the diode D is turned on, such that a current can flow through the second and third current sense resistors RC2 and RC3, and a voltage Vr2, which is equal to the voltage Vr1 applied to the first current sense resistor RC1, can be applied to the second and third current sense resistors RC2 and RC3.

By contrast, if the voltage Vr1, applied to the first current sense resistor RC1, is negative (−), the diode D is turned off and a circuit is open, such that a current cannot flow through the second and third current sense resistors RC2 and RC3, and a magnitude of the voltage Vr2 applied to the second and third current sense resistors RC2 and RC3 becomes zero.

Accordingly, a voltage Vr2, obtained by removing a negative voltage from the voltage Vr1 applied to the first current sense resistor RC1, can be applied to the second and third current sense resistors RC2 and RC3.

The second current sense resistor RC2 can be connected in series to the diode D. For example, one end of the second current sense resistor RC2 can be connected to the diode D, and the other end of the second current sense resistor RC2 can be connected to the third current sense resistor RC3.

The third current sense resistor RC3 can be connected in series to the second current sense resistor RC2. For example, one end of the third current sense resistor RC3 can be connected to the second current sense resistor RC2, and the other end of the third current sense resistor RC3 can be connected to the ground terminal.

The second and third current sense resistors RC2 and RC3 can be used for voltage distribution of the voltage Vr2, from which the negative voltage is removed.

In some implementations, a voltage distributed to the third current sense resistor RC3 can be applied to a positive input terminal of the first comparator CP1.

For example, the voltage Vr2, from which the negative voltage is removed, is distributed to the second and third current sense resistors RC2 and RC3, and the voltage distributed to the third current sense resistor RC3 is applied to the positive input terminal of the first comparator CP1. In some implementations, the voltage applied to the positive input terminal of the first comparator CP1 is required to be less than a driving voltage for driving the comparator CP1 itself.

The first comparator CP1 can be connected to a first node N1 between the second and third current sense resistors RC2 and RC3, to output a first voltage VO1.

The first comparator CP1 can determine the first voltage VO1 based on a comparison of the voltage, applied to the positive input terminal, with a first reference voltage Vref1 applied to the negative input terminal.

For example, the first reference voltage Vref1 can be a zero voltage which is a ground voltage, but it can be set to a voltage of a predetermined magnitude by considering a voltage drop due to noise, a leakage current, or the like. Accordingly, when a voltage V of a predetermined magnitude is distributed by first and second reference resistors Rf1 and Rf2, the first reference voltage Vref1 can be a voltage applied to the second reference resistor Rf2.

Figure 9:
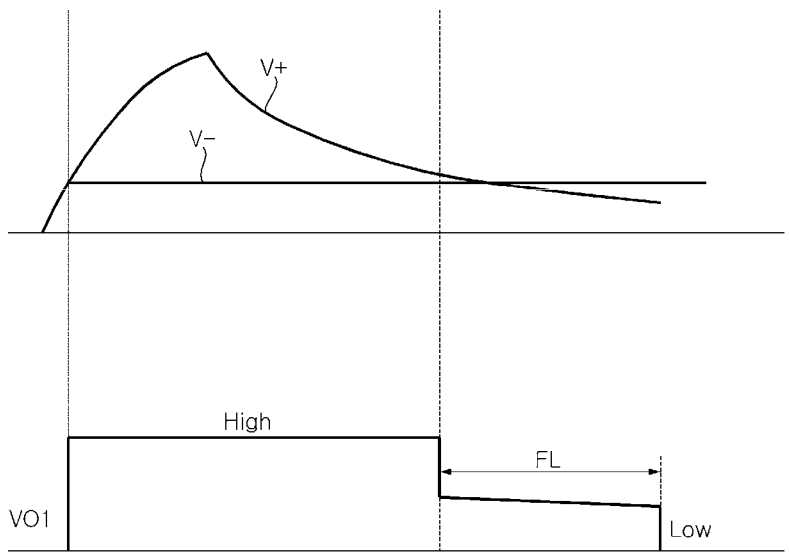

Further, as illustrated in FIG. 9, if the voltage V+, applied to the positive input terminal of the first comparator CP1, is greater than or equal to the voltage V− applied to the negative input terminal of the first comparator CP1, the first comparator CP1 can determine a value of the first voltage VO1 to be a predetermined voltage value (e.g., 5V) corresponding to a high state.

Moreover, if the voltage V+, applied to the positive input terminal of the first comparator CP1, is less than the voltage V− applied to the negative input terminal of the first comparator CP1, the comparator CP1 can determine a value of the first voltage VO1 to be a voltage value (e.g., 0V) corresponding to a low state.

However, FIG. 9 illustrates a case where the hysteresis circuit HY is not applied to the first comparator CP1, in which a floating period FL can occur if a state, in which the voltage V+ applied to the positive input terminal of the first comparator CP1 becomes similar to the voltage V− applied to the negative input terminal thereof, is maintained steadily.

For example, floating can refer to a case where the first voltage VO1, output from the first comparator CP1, is a voltage value other than the value corresponding to a high state or a low state.

By way of further example, if the first comparator CP1 includes a complementary metal-oxide semiconductor (CMOS) comparator, the floating period FL can occur as illustrated in FIG. 9, and in order to prevent the occurrence of the floating period FL, the current detector 300 can further include the hysteresis circuit HY as illustrated in FIG. 6.

The hysteresis circuit HY can be connected between the first node N1 and an output terminal of the first comparator CP1.

The hysteresis circuit HY can include a first hysteresis resistor RH1, connected between the first node N1 and the positive input terminal of the first comparator CP1, and a second hysteresis resistor RH2 having a first end, connected between the first hysteresis resistor RH1 and the positive input terminal, and a second end connected to the output terminal of the first comparator CP1.

Accordingly, the voltage Vr2, from which the negative voltage is removed by the diode D, can be distributed by the second and third current sense resistors RC2 and RC3 and the first and second hysteresis resistors RH1 and RH2, to be applied to the positive input terminal of the comparator CP1.

The voltage applied to the first node N1 can be affected by not only the voltage Vr2, from which the negative voltage is removed by the diode D, but also by the first voltage VO1 output from the first comparator CP1, and due to the effect of the first voltage VO1, the hysteresis circuit HY may not properly prevent the occurrence of the floating period FL.

In consideration of the above, values of the first and second hysteresis resistors RH1 and RH2 can be set to be greater than values of the second and third current sense resistors RC2 and RC3.

Figure 10:
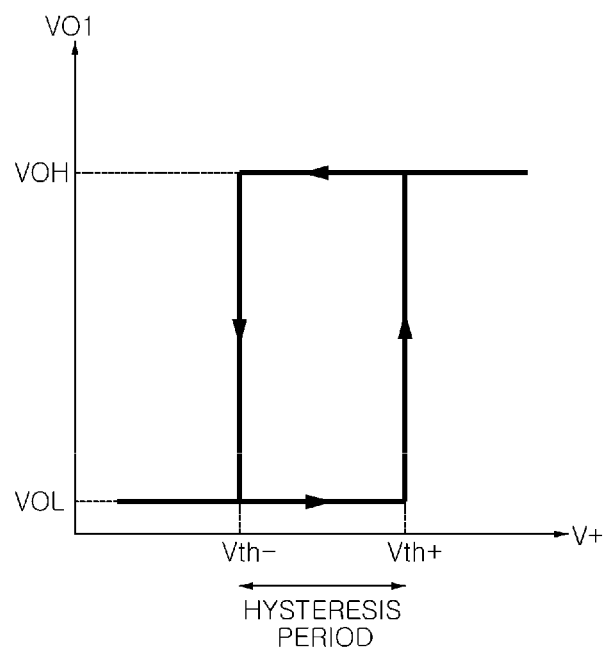

In addition, as illustrated in FIG. 10, the first comparator CP1, to which the hysteresis circuit HY is applied, can have two reference voltages, unlike a general comparator. Accordingly, based on the two reference voltages, the first comparator CP1 can have a graph of an output voltage value curve having a hysteresis form.

For example, the general comparator determines an output voltage value to be a high state or a low state based on one reference voltage applied to a negative input terminal. By contrast, the first comparator CP1, to which the hysteresis circuit HY is applied, can have a first threshold reference voltage Vth+, at which the first voltage VO1 as an output voltage value transitions from a low state VOL to a high state VOH, and a second threshold reference voltage Vth−, at which the first voltage VO1 transitions from the high state VOH to the low state VOL.

The first comparator CP1 can calculate the two threshold reference voltages Vth+ and Vth− by using the first reference voltage Vref1 applied to the negative input terminal, and can determine a value of the first voltage VO1 by comparing the voltage V+, which is distributed and applied to the positive input terminal, with the two threshold reference voltages Vth+ and Vth−.

Figure 11:
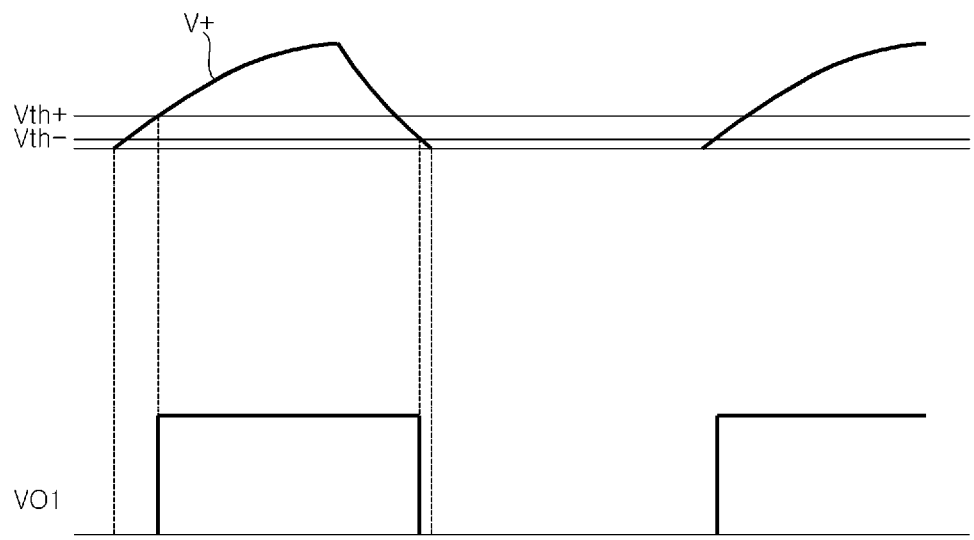

As illustrated in FIG. 11, if the voltage V+, applied to the positive input terminal of the first comparator CP1, is greater than or equal to the first threshold reference voltage Vth+, the first comparator CP1 can output the value of the first voltage VO1 as a high state; and if the voltage V+, applied to the positive input terminal of the first comparator CP1, is less than or equal to the second threshold reference voltage Vth−, the first comparator CP1 can output the value of the first voltage VO1 as a low state.

Further, if the first comparator CP1 includes an open-drain comparator, a response speed of the comparator is slower than the CMOS comparator but the floating period FL does not occur, such that the current detector 300 is not required to include the hysteresis circuit HY.

Referring back to FIG. 6, the voltage detector 350 can be connected to the output terminal of the inverter 140.

The voltage detector 350 can output a second voltage VO2 based on a voltage applied to the output terminal of the inverter 140, and the second voltage VO2 can be input to the phase signal output unit 400.

The voltage detector 350 can include first and second voltage sense resistors RV1 and RV2, and a second comparator CP2.

The first voltage sense resistor RV1 can be connected to the output terminal of the inverter 140. For example, a first end of the first voltage sense resistor RV1 can be connected to the second switching element S2 of the inverter 140, and a second end of the first voltage sense resistor RV1 can be connected to the second voltage sense resistor RV2.

The second voltage sense resistor RV2 can be connected in series to the first voltage sense resistor RV1. For example, a first end of the second voltage sense resistor RV2 can be connected to the first voltage sense resistor RV1 and a second end of the second voltage sense resistor RV2 can be connected to the ground terminal.

The first and second voltage sense resistors RV1 and RV2 can be used for voltage distribution of a voltage Vs2 applied to the output terminal of the inverter 140.

In some implementations, the voltage Vs2, applied to the output terminal of the inverter 140, can be distributed by the first and second voltage sense resistors RV1 and RV2, and the voltage distributed to the second voltage sense resistor RV2 can be applied to the positive input terminal of the second comparator CP2.

For example, the voltage Vs2, applied to the output terminal of the inverter 140, is distributed to the first and second voltage sense resistors RV1 and RV2, and the voltage distributed to the second voltage sense resistor RV2 is applied to the positive input terminal of the second comparator CP2. In some implementations, the voltage applied to the positive input terminal of the second comparator CP2 is required to be less than a driving voltage for driving the second comparator CP2 itself.

The second comparator CP2 can be connected to a second node N2 between the first and second voltage sense resistors RV1 and RV2, and output a second voltage VO2.

The second comparator CP2 can determine the second voltage VO2 based on a comparison of the voltage, applied to the positive input terminal, with a second reference voltage Vref2 applied to the negative input terminal.

For example, the second reference voltage Vref2 can be a zero voltage which is a ground voltage, but can be set to a voltage of a predetermined magnitude by considering a voltage drop due to noise, a leakage current, or the like. Accordingly, when a voltage V of a predetermined magnitude is distributed by third and fourth reference resistors Rf3 and Rf4, the second reference voltage Vref2 can be a voltage applied to the fourth reference resistor Rf4.

Further, if the voltage, applied to the positive input terminal of the second comparator CP2, is greater than or equal to the voltage Vref2 applied to the negative input terminal of the second comparator CP2, the second comparator CP2 can determine a value of the second voltage VO2 to be a predetermined voltage value (e.g., 5V) corresponding to a high state.

By contrast, if the voltage, applied to the positive input terminal of the second comparator CP2, is less than the voltage Vref2 applied to the negative input terminal of the second comparator CP2, the second comparator CP2 can determine a value of the second voltage VO2 to be a voltage value (e.g., 0V) corresponding to a low state.

In addition, unlike the first comparator CP1, the voltage Vs2 having a square wave form is distributed and applied to the positive input terminal of the second comparator CP2, and as a result, a difference occurs instantaneously between a magnitude of the voltage applied to the positive input terminal and a magnitude of the voltage applied to the negative input terminal at a specific time, such that floating hardly occurs. Accordingly, the hysteresis circuit HY may not be applied to the second comparator CP2. The CMOS comparator can be included in the second comparator CP2 as in the first comparator CP1, but the present disclosure is not limited thereto.

The phase signal output unit 400 can be connected to the current detector 300 and the voltage detector 350.

The phase signal output unit 400 can output a phase signal P based on the first voltage VO1, output from the current detector 300, and the second voltage VO2 output from the voltage detector 350, and the phase signal P can be input to the controller 180.

The phase signal output unit 400 can include first to third pulse generation resistors RP1 to RP3 and a third comparator CP3.

The first pulse generation resistor RP1 can be connected to the output terminal of the first comparator CP1 which is an output terminal of the current detector 300. For example, a first end of the first pulse generation resistor RP1 can be connected to the output terminal of the first comparator CP1, and a second end of the first pulse generation resistor RP1 can be connected to a fourth node N4.

For example, the fourth node N4 can refer to a node disposed between a third node N3, which is connected between the second and third pulse generation resistors RP2 and RP3, and the first pulse generation resistor RP1, and the third node N3 and the fourth node N4 can be a node that is electrically same.

The second pulse generation resistor RP2 can be connected to the output terminal of the second comparator CP2 which is an output terminal of the voltage detector 350. For example, a first end of the second pulse generation resistor RP2 can be connected to the output terminal of the second comparator CP2, and a second end of the second pulse generation resistor RP2 can be connected to the third node N3.

The third pulse generation resistor RP3 can be connected between the second pulse generation resistor RP2 and the ground terminal. For example, a first end of the third pulse generation resistor RP3 can be connected to the third node N3, and a second end of the third pulse generator resistor RP3 can be connected to the ground terminal.

Along with the first and second pulse generation resistors RP1 and RP2, the third pulse generation resistor RP3 can distribute a voltage Vadd, applied to a positive input terminal of the third comparator CP3, such that the voltage Vadd can be less than a driving voltage for driving the third comparator CP3 itself.

For example, the first voltage VO1, output from the current detector 300, is distributed by the first to third pulse generation resistors RP1 to RP3 in a first voltage distribution process, to be applied to the fourth node N4; and the second voltage VO2, output from the voltage detector 350, is distributed by the first to third pulse generation resistors RP1 to RP3 in a second voltage distribution process, to be applied to the fourth node N4.

Further, the voltage, applied to the fourth node N4 through the first voltage distribution process, can be merged with the voltage applied to the fourth node N4 through the second voltage distribution process, to be applied to the positive input terminal of the third comparator CP3.

In addition, the third comparator CP3 can be connected to the third node N3 (e.g., the fourth node N4) between the second and third pulse generation resistors RP2 and RP3, to output a pulse P.

The third comparator CP3 can generate a phase signal P based on a comparison of the voltage, applied to the positive input terminal, with a third reference voltage Vref3 applied to the negative input terminal. In some implementations, the phase signal can be a pulse signal.

For example, the third reference voltage Vref3 can be a voltage applied to a sixth reference resistor Rf6 when a voltage V of a predetermined magnitude is distributed by fifth and sixth reference resistors Rf5 and Rf6.

For example, in the case where the resistance of the first and second pulse generation resistors RP1 and RP2 is 100 kΩ, and the resistance of the third pulse generation resistor RP3 is 18 kΩ, the voltage Vadd applied to the positive input terminal of the third comparator CP3 can be 0.66 V if any one of the first and second voltages VO1 and VO2 is 0 V and the other one is 5 V; and the voltage Vadd can be 1.32 V if both of the first and second voltages VO1 and VO2 are 5V. In some implementations, the third reference voltage Vref3 can be set to a value (e.g., 1 V) between 0.66 V and 1.32 V.

Accordingly, if both of the first and second voltages VO1 and VO2 are 5 V, the voltage Vadd applied to the positive input terminal is greater than or equal to the third reference voltage Vref3 applied to the negative input terminal, such that the third comparator CP3 can output a phase signal P in a high state.

By contrast, if any one of the first and second voltages VO1 and VO2 is 0 V, the voltage Vadd applied to the positive input terminal is less than the third reference voltage Vref3 applied to the negative input terminal, such that the third comparator CP3 can output a phase signal P in a low state.

For example, if both of the first and second voltages VO1 and VO2 are in a high state (e.g., 5 V), a high-state phase signal P can be output from the phase detector 170, and if any one of the first and second voltages VO1 and VO2 is in a low state (e.g., 0 V), a low-state phase signal P can be output from the phase detector 170.

Figure 12:
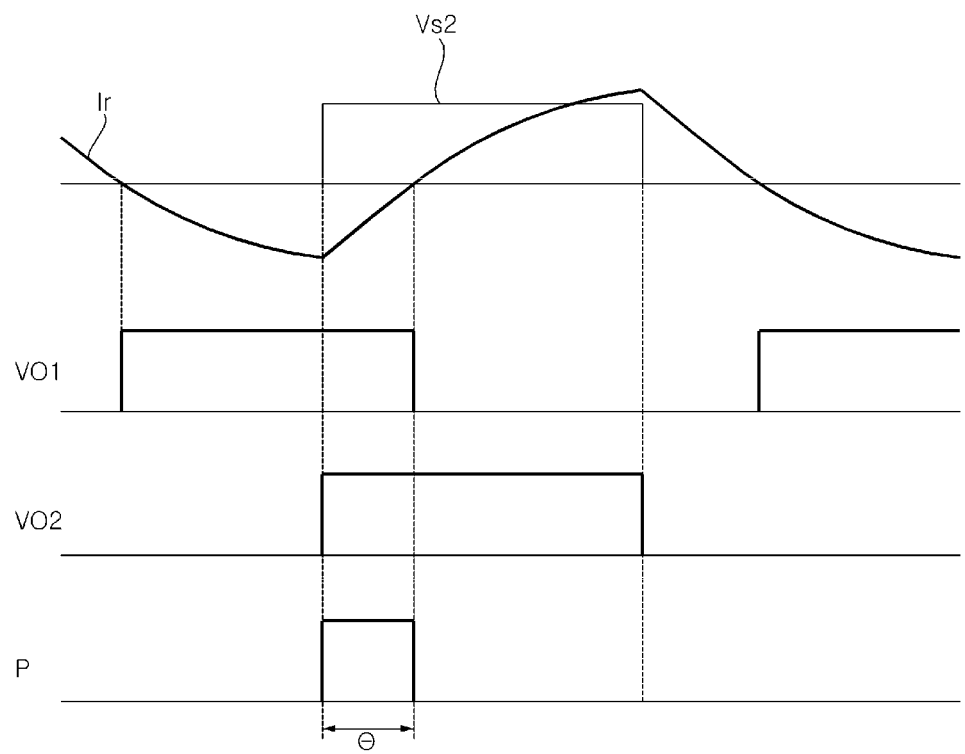

In some implementations, as illustrated in FIG. 12, a pulse width of the phase signal P, output from the phase detector 170, corresponds to a time delay between a zero crossing point of the resonant current Ir and a zero crossing point of the switching voltage Vs2, i.e., a phase difference θ between the resonant current Ir, applied to the working coil 150, and the switching voltage Vs2 applied to the second switching element S2.

Accordingly, based on the pulse width of the phase signal P, the controller 180 can calculate the phase difference θ between the voltage Vs2, applied to the output terminal of the inverter 140, and the resonant current Ir applied to the working coil 150.

In addition, the controller 180 can further receive a signal representative of a magnitude of the resonant current Ir applied to the working coil 150. For example, the cooking apparatus 1 can further include a current detector for detecting the resonant current Ir.

The current detector can include a current transformer, a shunt resistor, etc., for the current detection, and the detected current can be input to the controller 180.

Further, the current detector can include a current transformer 200 of the phase detector 170, and can output a signal representative of the resonant current Ir to the controller 180 based on the current generated by the current transformer 200.

The controller 180 can calculate temperature of a target object based on at least one of a magnitude of the resonant current Ir applied to the working coil 150, or a phase difference θ between the voltage Vs2, applied to the output terminal of the inverter 140, and the resonant current Ir applied to the working coil 150.

In some implementations, the controller 180 can calculate the temperature of the target object based on a regression equation, using at least one of the magnitude of the resonant current Ir or the phase difference θ between the resonant current Ir and the voltage Vs2 applied to the resonant circuit as an independent variable, and the temperature of the target object as a dependent variable.

Further, the controller 180 can output a switching signal Sic to the inverter 140 based on the calculated temperature of the target object.

For example, if the calculated temperature of the target object is lower than a target temperature, the controller 180 can output the switching signal Sic to the switching elements S1 and S2, such that the frequency of the current Ir flowing through the working coil 150 can be reduced.

For example, if the calculated temperature of the target object is higher than the target temperature, the controller 180 can output the switching signal Sic to the switching elements S1 and S2, such that the frequency of the current Ir flowing through the working coil 150 can be increased.

In some implementations, the controller 180 can change the frequency of the resonant current Ir based on a difference between the calculated temperature of the target object and the target temperature, and a current frequency of the resonant current Ir.

As described above, according to various implementations of the present disclosure, the temperature of the target object can be detected accurately, without using a separate temperature sensor, based on the voltage, applied to the output terminal of the inverter 140, and the phase difference θ between the voltage, applied to the output terminal of the inverter 140, and the current applied to the working coil 150, thereby improving price competitiveness; and defects such as the damage to a temperature sensor and the like which makes it impossible to detect temperature can be limited, thereby improving reliability in product performance.

In addition, according to various implementations of the present disclosure, an optimal output can be provided according to the temperature of the target object, thereby improving user satisfaction.

What is claimed is:

1. A cooking apparatus, comprising:
    a working coil;
    an inverter including a plurality of switching elements and configured to apply, by operating the plurality of switching elements, a resonant current of a predetermined frequency to the working coil;
    a phase detector configured to detect a phase difference between the resonant current and a voltage applied to an output terminal of the inverter, and to output a phase signal corresponding to the phase difference; and
    a controller,
    wherein the phase detector comprises:
        a current transformer including (i) an input coil connected between the inverter and the working coil and (ii) an output coil configured to generate an output current corresponding to the resonant current flowing through the input coil,
        a first current sense resistor connected to the output coil, a diode having an anode connected to the first current sense resistor, a first comparator configured to output a first voltage corresponding to a result of comparing a voltage corresponding to a cathode of the diode with a first reference voltage, a second comparator configured to output a second voltage corresponding to a result of comparing a voltage corresponding to both ends of a first switching element of the plurality of switching elements with a second reference voltage, a first pulse generation resistor connected to an output terminal of the first comparator, a second pulse generation resistor connected to an output terminal of the second comparator and the first pulse generation resistor, and a third comparator configured to output the phase signal as a third voltage corresponding to a result of comparing a voltage corresponding to a node to which the first and the second pulse generation resistors are connected with a third reference voltage, wherein a pulse width of the phase signal corresponds to a time delay between a zero-crossing point of the resonant current and a zero-crossing point of the voltage applied to the output terminal of the inverter, and wherein the controller is configured to:
identify the phase difference based on the pulse width of the phase signal, and
calculate a temperature of a target object placed above the working coil based on a first regression equation that uses the phase difference as an independent variable and the temperature of the target object as a dependent variable.

2. The cooking apparatus of claim 1, wherein the controller is configured to:
control, based on the temperature of the target object being lower than a target temperature, the operation of the plurality of switching elements to reduce a frequency of the resonant current; and
control, based on the temperature of the target object being higher than the target temperature, the operation of the plurality of switching elements to increase a frequency of the resonant current.

3. The cooking apparatus of claim 2, further comprising a current detector configured to detect the resonant current,
wherein the controller is configured to calculate, based on a second regression equation that uses (i) a magnitude of the resonant current detected by the current detector and the detected phase difference as independent variables and (ii) the temperature of the target object as a dependent variable, the temperature of the target object.

4. The cooking apparatus of claim 3, wherein the magnitude of the resonant current is a peak value of the resonant current.

5. The cooking apparatus of claim 1, wherein the phase detector comprises:
a second current sense resistor connected to the cathode of the diode; and
a third current sensor resistor having a first end connected to the second current sense resistor and a second end connected to a ground terminal,
wherein the first comparator includes (i) a first positive input terminal that is connected to a first node located between the second current sense resistor and the third current sense resistor and (ii) a first negative input terminal to which the first reference voltage is applied.

6. The cooking apparatus of claim 5, wherein the first comparator is configured to:
determine, based on a voltage applied to the first positive input terminal being greater than or equal to the first reference voltage applied to the first negative input terminal, a value of the first voltage to be a voltage value corresponding to a high state; and
determine, based on a voltage applied to the first positive input terminal being less than the first reference voltage applied to the first negative input terminal, the value of the first voltage to be a voltage value corresponding to a low state.

7. The cooking apparatus of claim 1, wherein the phase detector comprises:
a first voltage sense resistor connected to the first switching element; and
a second voltage sense resistor having a first end connected to the first voltage sense resistor and a second end connected to a ground terminal,
wherein the second comparator includes (i) a second positive input terminal connected to a second node located between the first voltage sense resistor and the second voltage sense resistor and (ii) a second negative input terminal to which the second reference voltage is applied.

8. The cooking apparatus of claim 7, wherein the second comparator is configured to:
determine, based on a voltage applied to the second positive input terminal being greater than or equal to the second reference voltage applied to the second negative input terminal, a value of the second voltage to be a voltage value corresponding to a high state; and
determine, based on a voltage applied to the second positive input terminal is less than the second reference voltage applied to the second negative input terminal, the value of the second voltage to be a voltage value corresponding to a low state.

9. The cooking apparatus of claim 1, wherein the phase detector comprises:
a third pulse generation resistor connected between the second pulse generation resistor and a ground terminal; and
a third comparator includes (i) a third positive input terminal connected to a third node to which the first to third pulse generation resistors are connected and (ii) a third negative input terminal to which the third reference voltage is applied.

10. The cooking apparatus of claim 9, wherein the third comparator is configured to:
generate, based on a voltage applied to the third positive input terminal being greater than or equal to the third reference voltage applied to the third negative input terminal, the phase signal in a high state; and
generate, based on a voltage applied to the third positive input terminal being less than the third reference voltage applied to the third negative input terminal, the phase signal in a low state.

11. The cooking apparatus of claim 10, wherein the controller is configured to identify the pulse width of the phase signal based on a period of time during which the phase signal in the high state is received.

12. The cooking apparatus of claim 11, wherein the first switching element is a switching element connected between the working coil and the ground terminal.

13. The cooking apparatus of claim 1, further comprising:
a glass cooktop on which the target object is placed and disposed adjacent to the working coil, wherein the glass cooktop is made of a tempered glass of ceramic material.

14. The cooking apparatus of claim 5, wherein the phase detector further comprises:
- a hysteresis circuit connected between the first node and an output terminal of the first comparator.

15. The cooking apparatus of claim 14, wherein the hysteresis circuit includes:
- a first hysteresis resistor connected between the first node and the first positive input terminal; and
- a second hysteresis resistor having a first end connected between the first hysteresis resistor and the first positive input terminal and a second end connected to the output terminal of the first comparator.

16. The cooking apparatus of claim 9, wherein the first to third pulse generation resistors are configured to distribute a voltage applied to the third positive input terminal.

17. The cooking apparatus of claim 1, wherein the plurality of switching elements are insulated gate bipolar transistors.

* * * * *